US012674845B2

(12) United States Patent
Fukamachi

(10) Patent No.: US 12,674,845 B2
(45) Date of Patent: Jul. 7, 2026

(54) DETERIORATION LEVEL CALCULATION METHOD FOR SECONDARY BATTERY AND NON-TRANSITORY COMPUTER-READABLE MEDIUM STORING DETERIORATION LEVEL CALCULATION PROGRAM

(71) Applicant: PRIMEARTH EV ENERGY CO., LTD., Shizuoka (JP)

(72) Inventor: Soichiro Fukamachi, Toyohashi (JP)

(73) Assignee: TOYOTA BATTERY CO., LTD., Kosai (JP)

( * ) Notice: Subject to any disclaimer, the term of this patent is extended or adjusted under 35 U.S.C. 154(b) by 393 days.

(21) Appl. No.: 18/473,960

(22) Filed: Sep. 25, 2023

(65) Prior Publication Data

US 2024/0125866 A1 Apr. 18, 2024

(30) Foreign Application Priority Data

Oct. 5, 2022 (JP) ................................. 2022-160716

(51) Int. Cl.
| | |
|---|---|
| *G01R 31/392* | (2019.01) |
| *G01R 31/36* | (2020.01) |
| *G01R 31/3835* | (2019.01) |

(52) U.S. Cl.
CPC ....... *G01R 31/392* (2019.01); *G01R 31/3648* (2013.01); *G01R 31/3835* (2019.01)

(58) Field of Classification Search
CPC .............. G01R 31/392; G01R 31/3835; G01R 31/3648
See application file for complete search history.

(56) References Cited

U.S. PATENT DOCUMENTS

2013/0314050 A1* 11/2013 Matsubara ................ H02J 7/00
                                                                    320/134
2017/0212170 A1* 7/2017 Torai ................... H01M 10/482

FOREIGN PATENT DOCUMENTS

| JP | 2013247003 A | * 12/2013 | ................ H02J 7/00 |
|---|---|---|---|
| JP | 2017129493 A | 7/2017 | |
| WO | WO-2014128902 A1 * | 8/2014 | ............ H01M 10/48 |

(Continued)

OTHER PUBLICATIONS

Ashikur Rahman "Li-ion battery individual electrode state of charge and degradation monitoring using battery casing through auto curve matching for standard CCCV charging profile", pp. 1-12 Elsevier (Year: 2022).*

*Primary Examiner* — Andrew Schechter
*Assistant Examiner* — Kaleria Knox
(74) *Attorney, Agent, or Firm* — McCoy Russell LLP

(57) ABSTRACT

A deterioration level calculation method for a secondary battery of the present disclosure includes: computing a measurement-based measured value charging rate voltage curve of a secondary battery and a theoretical value charging rate voltage curve derived from a component of the secondary battery; computing an evaluation value to evaluate a difference between a measured value and a theoretical value of the charging rate voltage curves by using an evaluation function in which a high charging rate region, a low charging rate region, and a difference evaluation value are weighted higher than a whole difference evaluation value; and outputting, as a parameter indicating a deterioration level, a shift amount in a charting direction applied to the theoretical value charging rate voltage curve when the evaluation value is minimized.

6 Claims, 5 Drawing Sheets

(56) References Cited

FOREIGN PATENT DOCUMENTS

| WO | WO-2019194205 A1 | * | 10/2019 | ............ | H01M 10/48 |
| WO | WO-2020033343 A1 | * | 2/2020 | ........... | G01R 31/392 |

* cited by examiner

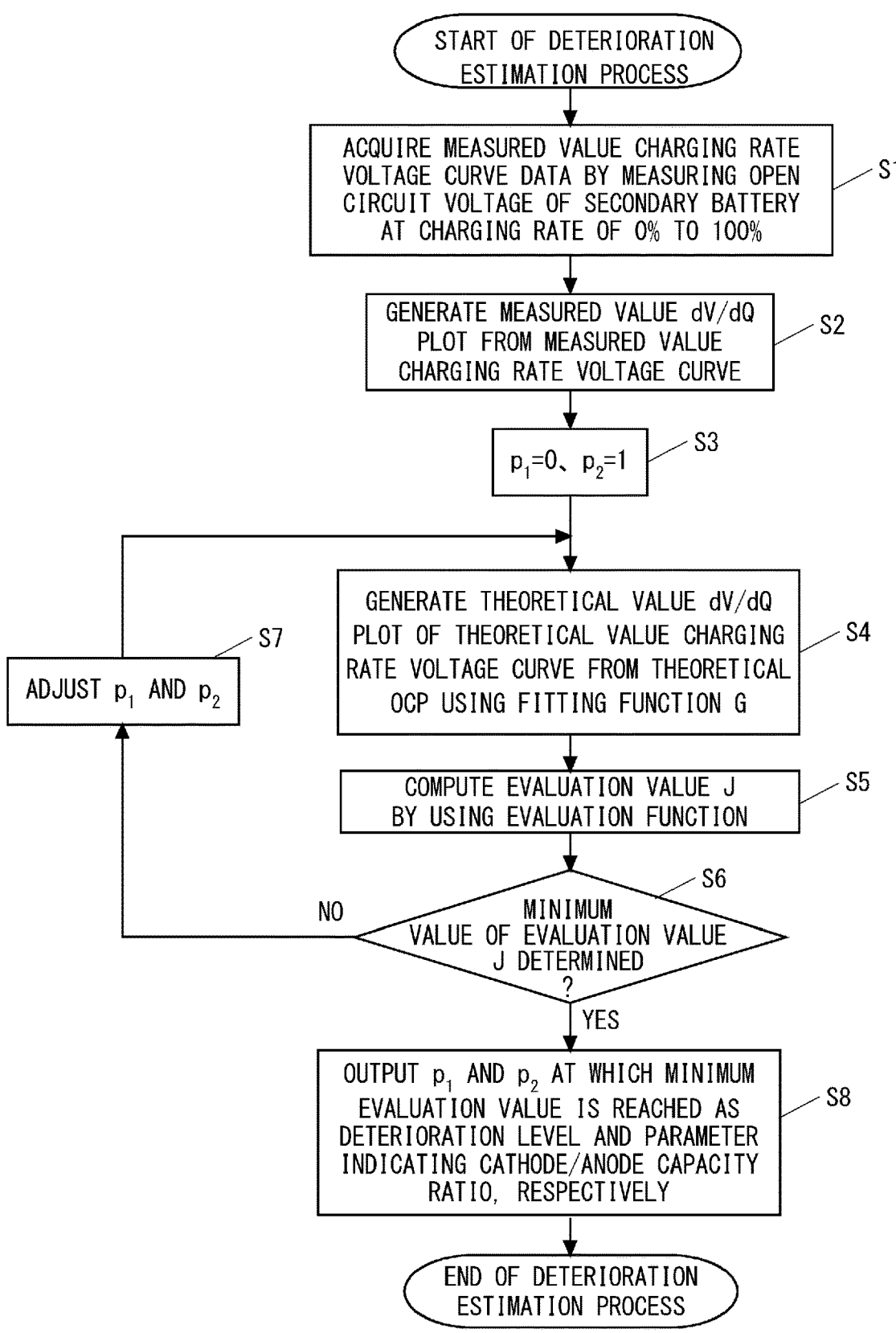
F i g. 5

DETERIORATION LEVEL CALCULATION METHOD FOR SECONDARY BATTERY AND NON-TRANSITORY COMPUTER-READABLE MEDIUM STORING DETERIORATION LEVEL CALCULATION PROGRAM

CROSS REFERENCE TO RELATED APPLICATION

This application is based upon and claims the benefit of priority from Japanese patent application No. 2022-160716, filed on Oct. 5, 2022, the disclosure of which is incorporated herein in its entirety by reference.

BACKGROUND

The present disclosure relates to a deterioration level calculation method and a deterioration level calculation program for a secondary battery that calculate, for example, a deterioration level for determining deterioration of a secondary battery.

Secondary batteries such as a lithium-ion battery have recently been increasingly used. A use of secondary batteries would lead to a failure in satisfying a desired performance due to progression of deterioration. However, since secondary batteries are used in a variety of situations, the desired performances of the secondary batteries are different depending on use situation. For example, a secondary battery may still exhibit a performance sufficient for a use as a fixed storage battery for home use even though not being able to satisfy a performance as a drive power source for an automobile. For such a reason, a reuse of secondary batteries is discussed. However, in order to use secondary batteries for another purpose, it is necessary to determine whether or not a recovered secondary battery is reusable based on a deterioration level of the secondary battery. Accordingly, International Patent Publication No. WO 2014/128902, Japanese Unexamined Patent Application Publication No. 2013-247003 and Japanese Unexamined Patent Application Publication No. 2017-129493 describe technologies of determination of a deterioration level of a secondary battery.

A deterioration diagnosis method for a secondary battery according to International Patent Publication No. WO 2014/128902 is a deterioration diagnosis method for a secondary battery that makes a diagnosis of a deterioration of a secondary battery including a mixed cathode or a mixed anode including a mixture of at least two or more active materials, the method including: a first step of acquiring charging/discharging characteristics of the secondary battery; a second step of acquiring a plurality of pieces of information regarding the active materials stored in a memory; a third step of determining a mixing ratio of the cathode or the anode from the plurality of pieces of information regarding the active materials and the charging/discharging characteristics; a fourth step of predicting charging/discharging characteristics of the secondary battery based on the mixing ratio determined in the third step; and a fifth step of comparing the predicted charging/discharging characteristics and the charging/discharging characteristics acquired in the first step and computing, in response to the predicated charging/discharging characteristics and the charging/discharging characteristics acquired in the first step matching, a deterioration parameter based on a potential of the mixed cathode predicated using the mixing ratio or a potential of the mixed anode predicated using the mixing ratio.

A deterioration level estimation apparatus according to Japanese Unexamined Patent Application Publication No. 2013-247003 includes a deterioration level detection/evaluation unit that detects and evaluates a deterioration level of a secondary battery. The deterioration level detection/evaluation unit measures a change of voltage between a cathode and an anode at the time of charging or discharging the secondary battery, obtains an inflection point at the measured change of voltage and a voltage value at the inflection point, and further obtains a deterioration level of the secondary battery based on a difference between the inflection point and an initial inflection point obtained in advance and a difference between the voltage value at the inflection point and an initial voltage value at the initial inflection point obtained in advance.

A secondary battery capacity measurement system according to Japanese Unexamined Patent Application Publication No. 2017-129493 includes: a data conversion unit that obtains, in measuring a maximum capacity of a secondary battery including a plurality of cells, a differential characteristic curve from history data including voltage values and current values of the battery acquired in chronological order, the differential characteristic curve indicating charging characteristics of the battery; a fitting arithmetic unit that compares a reference differential curve indicating charging characteristics of the battery and a measured differential characteristic curve of a selected cell to obtain a first coefficient by an arithmetic operation, the reference differential curve including a plurality of separate waveform differential curves multiplied by the first coefficient, the separate waveform differential curves each multiplied by a second coefficient indicating a ratio of deterioration; and a maximum capacity arithmetic unit that estimates a maximum capacity using the second coefficient, the second coefficient being obtained by fitting the first-coefficient-based reference differential curve with a measured partial differential characteristic curve of a non-selected cell.

SUMMARY

However, in order to make a diagnosis of a deterioration level, the technologies according to International Patent Publication No. WO 2014/128902, Japanese Unexamined Patent Application Publication No. 2013-247003, and Japanese Unexamined Patent Application Publication No. 2017-129493 require, for example, data regarding each state of deterioration from a new battery or information based on a battery design, such as a cathode/anode capacity ratio. Therefore, the technologies are disadvantageous in that it is not possible to know a deterioration level of a battery without such information regarding the battery.

The present disclosure has been made in view of the above-described circumstances and an object of the present disclosure is to make a diagnosis of a deterioration level of a secondary battery without the necessity of identifying a battery design and a use state of the battery in advance.

An aspect of a deterioration level calculation method for a secondary battery according to the present disclosure includes causing a computer to perform arithmetic processes including: a measured value acquisition process of generating a measured value charging rate voltage curve for a secondary battery by using a measurement result of an open circuit voltage at a charging rate in a range from 0% to 100%; a theoretical value generation process of generating a theoretical value charging rate voltage curve computed from a difference between a cathode open circuit potential theoretical value curve computed from a content of at least one component of a cathode composite of the secondary battery by using a fitting function and an anode open circuit potential theoretical value curve computed from a content of at least one component of an anode composite of the secondary battery; an evaluation value computation process of computing, with use of an evaluation function to compute an evaluation value, the evaluation value, the evaluation value indicating a magnitude of a difference between the theoretical value charging rate voltage curve and the measured value charging rate voltage curve; and an analysis process of repeating the theoretical value generation process and the evaluation value computation process with changes of a shift amount parameter and a scaling rate parameter and outputting the shift amount parameter at which the evaluation value is minimized as a deterioration level of the secondary battery, in the fitting function, the shift amount parameter for shifting one of the theoretical positive open circuit potential value curve and the theoretical negative open circuit potential value curve in the charging rate direction, the scaling rate parameter for adjusting the length of the other curve in the charging rate direction, in which the evaluation function includes a whole evaluation term representing a difference between the theoretical value charging rate voltage curve and the measured value charging rate voltage curve as a whole, a high charging rate region evaluation term representing a difference between the theoretical value charging rate voltage curve and the measured value charging rate voltage curve in a high charging rate region, and a low charging rate region evaluation term representing a difference between the theoretical value charging rate voltage curve and the measured value charging rate voltage curve in a low charging rate region, the high charging rate region evaluation term and the low charging rate region evaluation term being weighted higher than the whole evaluation term.

An aspect of a non-transitory computer-readable medium storing a deterioration level calculation program according to the present disclosure is provided, the program being configured to cause an arithmetic unit of a computer to perform: a measured value acquisition process of generating a measured value charging rate voltage curve for a secondary battery by using a measurement result of an open circuit voltage at a charging rate in a range from 0% to 100%; a theoretical value generation process of generating a theoretical value charging rate voltage curve computed from a difference between a cathode open circuit potential theoretical value curve computed from a content of at least one component of a cathode composite of the secondary battery by using a fitting function and an anode open circuit potential theoretical value curve computed from a content of at least one component of an anode composite of the secondary battery; an evaluation value computation process of computing, with use of an evaluation function to compute an evaluation value, the evaluation value, the evaluation value indicating a magnitude of a difference between the theoretical value charging rate voltage curve and the measured value charging rate voltage curve; and an analysis process of repeating the theoretical value generation process and the evaluation value computation process with changes of a shift amount parameter and a scaling rate parameter and outputting the shift amount parameter at which the evaluation value is minimized as a deterioration level of the secondary battery, in the fitting function, the shift amount parameter for shifting one of the theoretical positive open circuit potential value curve and the theoretical negative open circuit potential value curve in the charging rate direction, the scaling rate parameter for adjusting the length of the other curve in the charging rate direction, in which the evaluation function includes a whole evaluation term representing a difference between the theoretical value charging rate voltage curve and the measured value charging rate voltage curve as a whole, a high charging rate region evaluation term representing a difference between the theoretical value charging rate voltage curve and the measured value charging rate voltage curve in a high charging rate region, and a low charging rate region evaluation term representing a difference between the theoretical value charging rate voltage curve and the measured value charging rate voltage curve in a low charging rate region, the high charging rate region evaluation term and the low charging rate region evaluation term being weighted higher than the whole evaluation term.

The deterioration level calculation method and the deterioration level calculation program for a secondary battery of the present disclosure make it possible to make a diagnosis of a deterioration level of a secondary battery without the necessity of identifying a battery design and a use state of the battery in advance.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 5 is a flowchart for explaining an operation of a deterioration level calculation program for a secondary battery according to Embodiment 1.

DETAILED DESCRIPTION OF EMBODIMENTS

Figure 1:
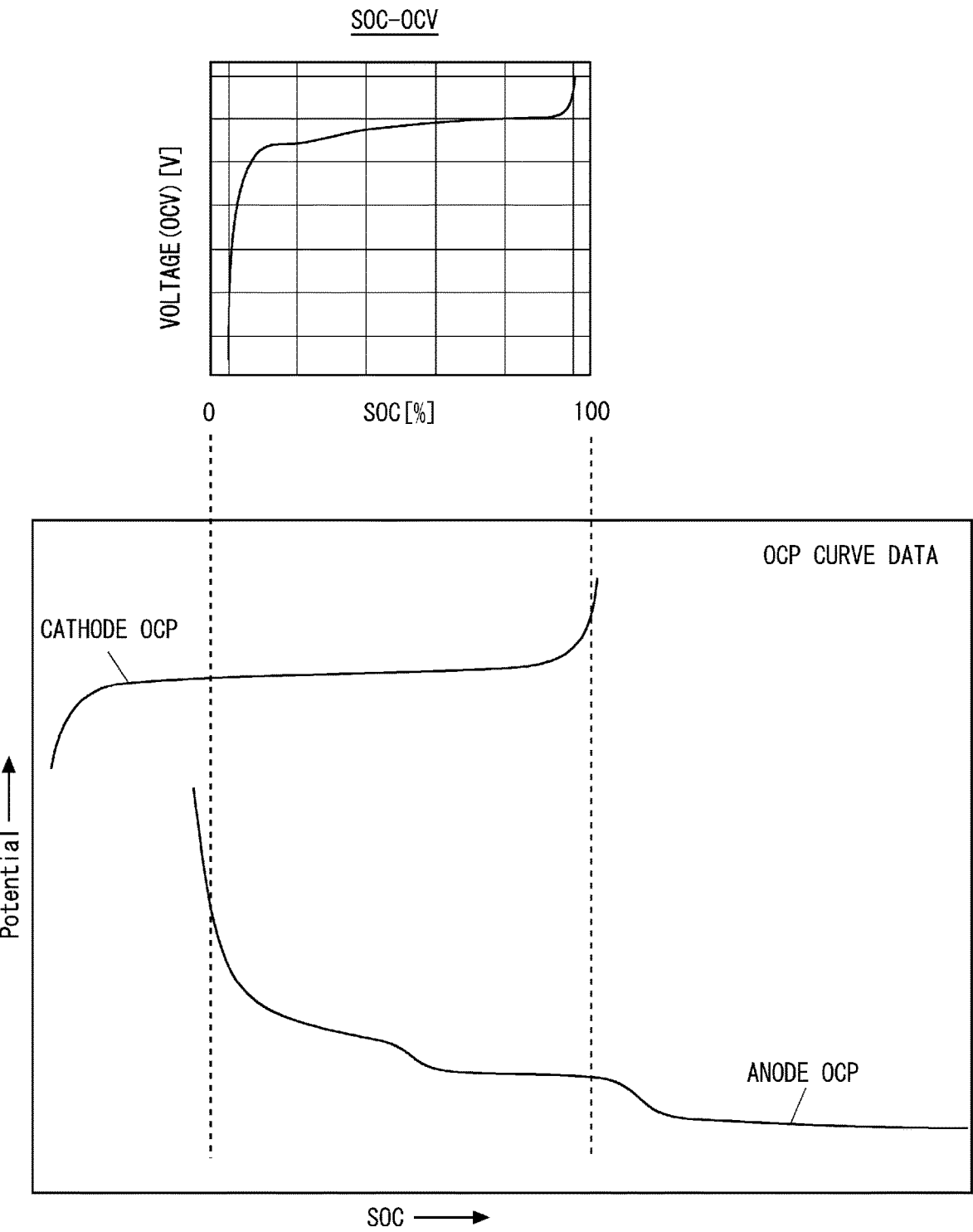
FIG. 1 is a graph for explaining a SOC-OCV curve that is to be used in a deterioration level calculation method for a secondary battery according to Embodiment 1.

For clarification of explanation, descriptions and drawings hereinbelow are omitted and simplified as appropriate. In addition, elements illustrated as functional blocks that perform various processes in the drawings can be provided by, in terms of hardware, a CPU (Central Processing Unit), a memory, or any other circuit or can be implemented by, in terms of software, a program loaded in a memory or the like. Accordingly, it should be understood by those skilled in the art that these functional blocks are able to be implemented in a variety of forms by hardware only, software only, or a combination thereof and any of them is not limiting. It should be noted that the same components are labeled with the same reference numeral in the drawings and repetition of description is omitted, if necessary.

In addition, the above-described program includes a command group (or software code) for causing a computer to execute one or more functions as described in an embodiment when read in the computer. The program may be stored in a non-transitory computer-readable medium or a substantial storage medium. The computer-readable medium or the substantially recording medium includes, without limitation and by way of example, a random-access memory (RAM), a read-only memory (ROM), a flash memory, a solid-state drive (SSD), or any other memory technology, a CD-ROM, a digital versatile disc (DVD), a Blu-ray (R) disc, or any other optical disc storage, and a magnetic cassette, a magnetic tape, a magnetic disk storage, or any other magnetic storage device. The program may be sent over a transitory computer-readable medium or a communication medium. The transitory computer-readable medium or the communication medium includes, without limitation and by way of example, an electrical, optical, or acoustic propagation signal or a propagation signal in any other form.

Embodiment 1

A deterioration level calculation method for a secondary battery according to Embodiment 1 includes performing an analysis process focused on an influence of a deterioration of a secondary battery on charging/discharging characteristics of the secondary battery. Incidentally, a lithium-ion battery is taken as an example of the secondary battery in the description below.

First, description will be made on the charging/discharging characteristics of the secondary battery. FIG. 1 illustrates a graph for explaining a charging rate voltage curve (hereinafter, referred to as SOC-OCV curve) that is to be used in the deterioration level calculation method for a secondary battery according to Embodiment 1.

As illustrated in FIG. 1, an open circuit voltage (OCV) of the secondary battery changes depending on a change of a charging rate. This change is attributed to changes of a potential of a cathode and a potential of an anode due to a charging/discharging operation. For a secondary battery, a difference between the potential of the cathode and the potential of the anode serves as an open circuit voltage generated between a cathode terminal and an anode terminal. The potential of the cathode and the potential of the anode are measurable as a cathode OCP (Open Circuit Potential) and an anode OCP, respectively. The cathode OCP and the anode OCP are also theoretically derivable from an active material contained in a composite applied to each of the electrodes.

In addition, the cathode OCP extends to a region of 0% or less in terms of charging rate (SOC (State Of Charge)) as illustrated in FIG. 1. This means that the charging rate of 0% is a state where a lithium amount acceptable to the anode is exceeded, that is, a state where lithium dischargeable to a cathode side remains even though the charging rate reaches 0%. In contrast, the anode OCP extends to a region of 100% or more in terms of charging rate in FIG. 1. This means that a charging rate of 100% is a state where a lithium amount acceptable to the cathode is exceeded, that is, a state where lithium dischargeable to an anode side remains even though the charging rate reaches 100%. As described later in detail, a deterioration of the secondary battery causes the cathode OCP to change into a form shifting toward a side for the charging rate to decrease and causes the anode OCP to change into a form stretching toward a side for the charging rate to increase.

Figure 2:
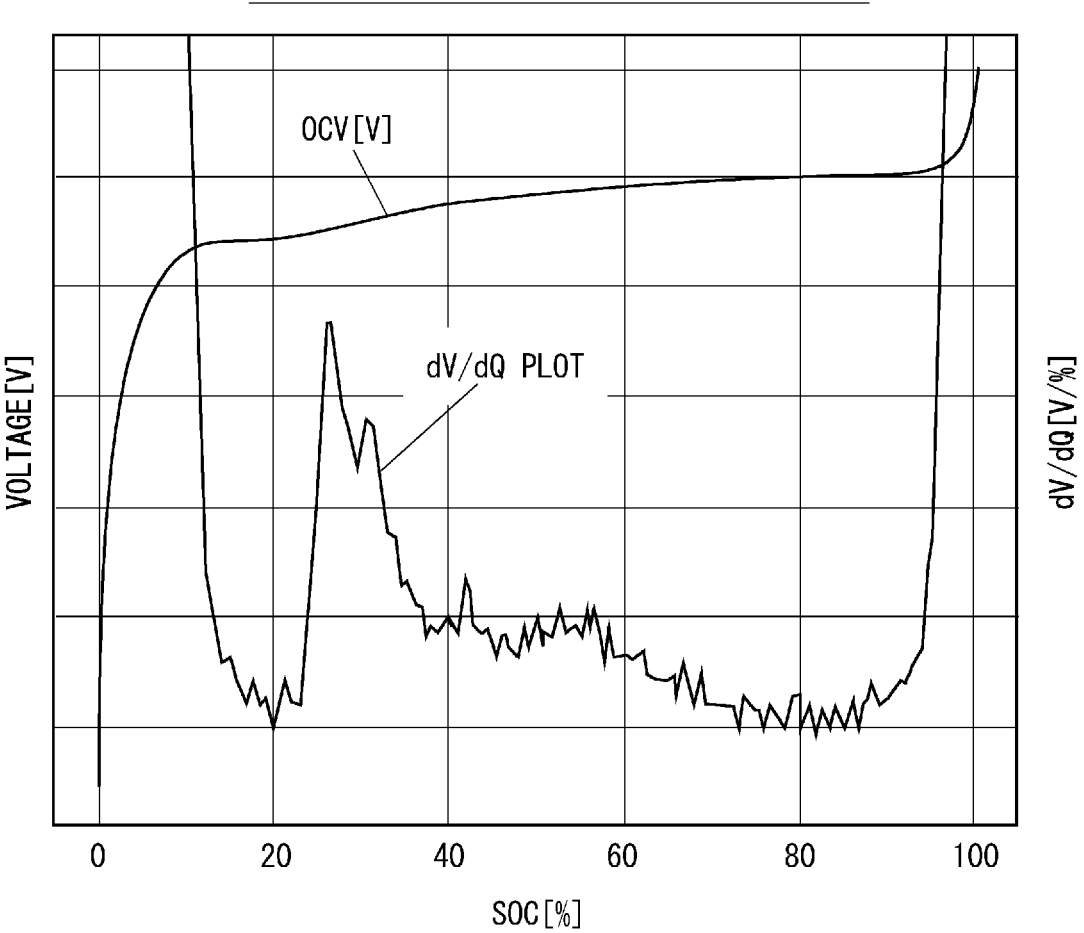
FIG. 2 is a graph for explaining a dV/dQ plot obtained from a measured value and that is to be used in the deterioration level calculation method for a secondary battery according to Embodiment 1.

Subsequently, in the deterioration level calculation method for a secondary battery according to Embodiment 1, a dV/dQ plot is used. The dV/dQ plot indicates a change of the open circuit voltage with a change of the charging rate during a computing process of a deterioration level of the secondary battery. Accordingly, FIG. 2 illustrates a graph for explaining a measured value differential plot (hereinafter, referred to as measured value dV/dQ plot) obtained from a measured value and that is to be used in the deterioration level calculation method for a secondary battery according to Embodiment 1. As illustrated in FIG. 2, the measured value dV/dQ plot is a curve in a form causing a changing point in the SOC-OCV curve to be more emphasized.

Figure 3:
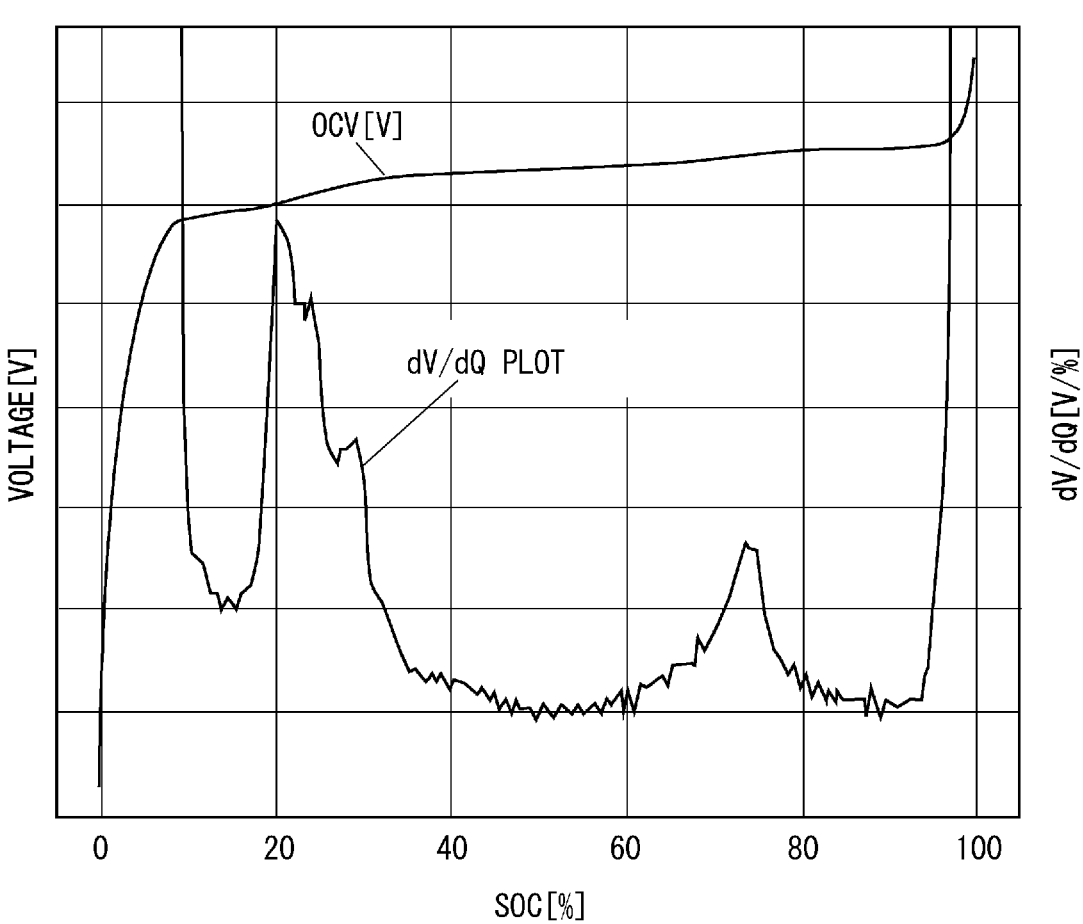
FIG. 3 is a graph for explaining a dV/dQ plot obtained from a theoretical value and that is to be used in the deterioration level calculation method for a secondary battery according to Embodiment 1.

In addition, the deterioration level calculation method for a secondary battery according to Embodiment 1 includes generating a theoretical value charging rate voltage curve (hereinafter, referred to as theoretical value SOC-OCV curve) from a difference between the cathode OCP and the anode OCP theoretically derived from the active material contained in the composite applied to each of the electrodes and generating a theoretical value differential plot (hereinafter, referred to as theoretical value dV/dQ plot) from the theoretical value SOC-OCV curve. Accordingly, FIG. 3 illustrates a graph for explaining the theoretical value dV/dQ plot obtained from a theoretical value and that is to be used in the deterioration level calculation method for a secondary battery according to Embodiment 1. The theoretical value dV/dQ plot illustrated in FIG. 3 is computed using a theoretical value cathode OCP generated based on a content of lithium iron phosphate contained in the composite of the cathode and a theoretical value anode OCP generated based on a content of carbon contained in the composite of the anode.

As illustrated in FIG. 3, the theoretical value dV/dQ plot has a form where a peak appears at a large change of a curvature of the theoretically derived logical value SOC-OCV curve. The theoretical value dV/dQ plot illustrated in FIG. 3 and the measured value dV/dQ plot illustrated in FIG. 2 are compared. As for the measured value, for example, a peak observed at a charging rate of 20% to 40%, approximately, is shifted toward a high charging rate side. In contrast, as for the theoretical value, a peak observed at a charging rate of 60% to 80%, approximately, is no longer the measured value dV/dQ plot. Such a difference is a phenomenon resulting from the occurrence of a change of the SOC-OCV curve due to the deterioration of the secondary battery.

In the deterioration level calculation method for a secondary battery according to Embodiment 1, such a shift of the peak and presence/absence of the peak are not directly evaluated but an evaluation is made with a focus on a change of OCP resulting from a deterioration of a battery. Accordingly, description will be made on a change of the OCP resulting from a deterioration of a battery and a fitting process that is to be used in the deterioration level calculation method according to Embodiment 1. Accordingly, FIG. 4 illustrates a graph for explaining the fitting process that is to be used in the deterioration level calculation method for a secondary battery according to Embodiment 1.

Figure 4:
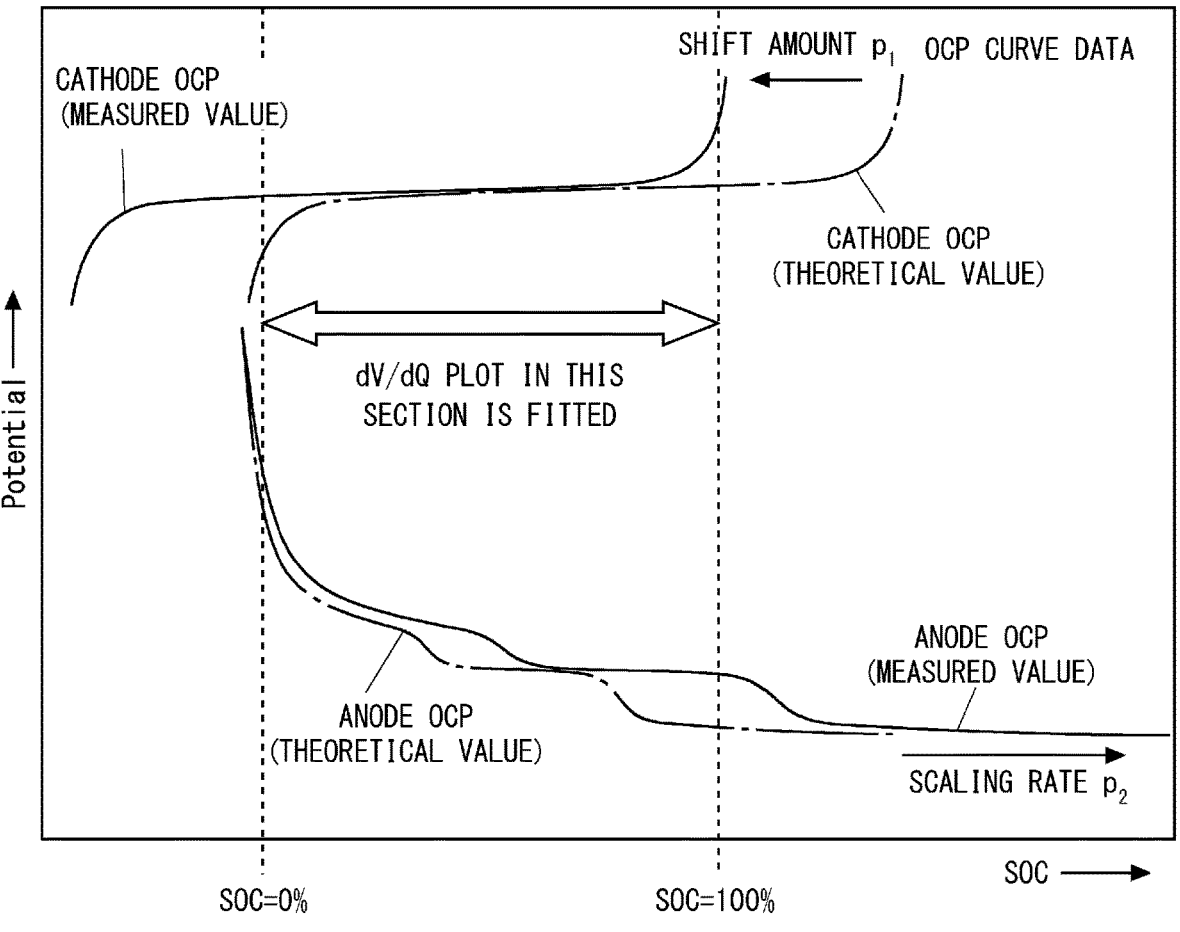
FIG. 4 is a graph for explaining a fitting process that is to be used in the deterioration level calculation method for a secondary battery according to Embodiment 1.

FIG. 4 illustrates a cathode OCP and an anode OCP computed from a measured value acquired from a battery that is a target for determination of deterioration level, a cathode OCP that is a theoretical value and generated based on the content of lithium iron phosphate contained in the composite of the cathode, and an anode OCP that is a theoretical value and generated based on the content of carbon contained in the composite of the anode. The OCP as the theoretical value can be assumed to be an OCP of a battery in a non-deteriorated state.

As illustrated in FIG. 4, the cathode OCP tends to shift in a direction where the charging rate decreases with progression of the deterioration of the secondary battery. In contrast, the anode OCP tends to be deformed causing the curve to stretch in a direction where the charging rate increases with progression of the deterioration of the secondary battery. As for the secondary battery, such a change of the OCP causes the form of the SOC-OCV curve to change due to a deterioration.

In the deterioration level calculation method for a secondary battery according to Embodiment 1, a feature of the change of the form of the OCP as illustrated in FIG. 4 is leveraged to compute a shift amount p1 of the cathode OCP as a deterioration level parameter. More specifically, the shift amount p1 indicating the deterioration level is computed in accordance with the following procedure.

In the deterioration level calculation method for a secondary battery according to Embodiment 1, the theoretical value cathode OCP is shifted by using a fitting function G represented by (1) Expression and the theoretical value dV/dQ plot is generated from a theoretical value SOC-OCV curve derived from an OCP curve with scaling of a theoretical value anode OCP being changed. In other words, the fitting function G of (1) Expression represents the theoretical value dV/dQ plot.

Math. 1

$$G(x, p_1, p_2) = \frac{d}{dx}\{f_p(x + p_1) - f_n(p_2x)\} \quad (1)$$

In (1) Expression, x denotes a charging rate, fp is a cathode OCP, fn is an anode OCP, p1 is a shift amount of the cathode OCP, and p2 is a scaling rate of the anode OCP. The shift amount p1 includes a positive value equal to or less than 100 and the scaling rate p2 includes a positive value more than zero. In the deterioration level calculation method for a secondary battery according to Embodiment 1, a measured value differential plot, which is generated from a measured value SOC-OCV curve at a charging rate in a range from 0% to 100%, and a theoretical value differential plot are fitted by using the fitting function G. It is evaluated whether or not the fitting is successful by using an evaluation function described later.

In addition, in the deterioration level calculation method for a secondary battery according to Embodiment 1, an evaluation value J is computed by using an evaluation function represented by (2) Expression and validity of shift amount p1 and the scaling rate p2 is evaluated based on the evaluation value J.

Math. 2

$$J = \int_0^{100} \left( (dVdQ_{OCP} - dVdQ_{data})^2 dSOC \right.$$
$$+ k_1 \int_0^\alpha (\log_{10} dVdQ_{OCP} - \log_{10} dVdQ_{data})^2 dSOC$$
$$+ k_2 \int_\beta^{100} (dVdQ_{OCP} - dVdQ_{data})^2 dSOC \quad (2)$$

In (2) Expression, dVdQOCP is the fitting function G and dVdQdata is a measured value dV/dQ plot obtained by measuring an actual battery. In addition, k1, k2, α, and β are adjustment functions.

Here, as for the evaluation function used in Embodiment 1, a first term of (2) Expression is a whole evaluation term for evaluating a difference between the theoretical value dV/dQ plot and the measured value dV/dQ plot throughout the charging rates. In addition, a second term of (2) Expression is caused to be a low charging rate region evaluation term representing a difference between the theoretical value dV/dQ plot and the measured value dV/dQ plot at a charging rate in a range of 0% to 30% (namely, a low charging rate region) by setting the adjustment function α at, for example, a value larger than zero and smaller than 30. A third term of (2) Expression is caused to be a high charging rate region evaluation term representing a difference between the theoretical value dV/dQ plot and the measured value dV/dQ plot at a charging rate in a range from 70% to 100% (namely, a high charging rate region) by setting the adjustment function β at, for example, a value smaller than 100 and larger than 70. The adjustment function α is a value as large preferably 20, more preferably 15. The adjustment function β is a value as large as preferably 80, more preferably 85.

Further, in (2) Expression, the second term is multiplied by the adjustment function k1 and the third term is multiplied by the adjustment function k2. The adjustment functions k1, k2, which are functions for increasing weights of the low charging rate region evaluation term (for example, the second term) and the high charging rate region evaluation term (for example, the third term) to be more than that of the whole evaluation term (for example, the first term), are preferably, for example, values equal to or more than 100.

In addition, in (2) Expression, a value for evaluating the difference in the second term is a logarithmic value. This is a technique for giving priority to matching of a base of a peak of the differential plot over a crest of the peak. Such a technique is effective in a case where fitting related to a feature of a peak form is regarded as important. In (2) Expression, the differential plot contained in both the second term and the third term may be the logarithmic value, the differential plot contained in either one of the second term and the third term may be the logarithmic value, or the differential plot contained in both the second term and the third term is not necessarily the logarithmic value. The term containing the differential plot to which the logarithmic value is to be applied may be determined in accordance with fitting conditions and characteristics of the battery.

Addition of the second term and the third term to the evaluation function represented by (2) Expression enhances constraint conditions in the low charging rate region of the anode OCP and the high charging rate region of the cathode OCP, which are unlikely to experience a form change as a lithium insertion stress is small due to a deterioration of the secondary battery. Thus, the deterioration level calculation method using the evaluation function represented by (2) Expression makes it possible to determine the deterioration level of the secondary battery based on a shift amount parameter, which indicates the deterioration level, without the necessity of taking a difference in form of the OCP curve resulting from a difference in deterioration state of the battery into consideration.

In addition, in the deterioration level calculation method for a secondary battery according to Embodiment 1, the scaling rate p2 is changed. The scaling rate p2 is a parameter for estimating a cathode/anode capacity ratio and acquisition of the scaling rate p2 makes it possible to determine a change of the cathode/anode capacity ratio in addition to the deterioration level.

According to the foregoing description, the deterioration level calculation method for a secondary battery according to Embodiment 1 makes it possible to estimate the deterioration state even in a situation where data regarding each state of deterioration from when a battery is new or design information such as a cathode/anode capacity ratio is unknown. This makes it possible to encourage reuse of a used battery a feature of which is unknown. For example, although it takes an immense amount of time to acquire data regarding deterioration from when the battery is new, a use of the deterioration level calculation method for a secondary battery according to Embodiment 1 makes it possible to avoid the trouble of having to acquire data regarding deterioration.

In addition, the cathode/anode capacity ratio of the secondary battery would change with a deterioration. It is of concern that mismatch between a battery deterioration mode and prior assumption leads to an error in an estimation result of the cathode/anode capacity ratio. However, the scaling rate parameter indicating a change amount of the cathode/anode capacity ratio is acquired in addition to the deterioration state, which makes it possible to estimate the cathode/anode capacity ratio of the used battery irrespective of the deterioration mode. Therefore, a use of the deterioration level calculation method for a secondary battery according to Embodiment 1 makes it possible to further facilitate utilization.

Further, in the deterioration level calculation method for a secondary battery according to Embodiment 1, a cause of deterioration is identified from the shift amount p1 and the scaling rate p2 to broaden possible causes for the deterioration to a reduction in lithium amount of a cathode, a reduction in lithium acceptable amount of an anode, and a reduction in lithium, which eliminates the necessity of assuming the deterioration mode in advance. This makes it possible to estimate the deterioration state of the secondary battery with respect to broader deterioration modes.

Here, the deterioration level calculation method for a secondary battery according to Embodiment 1 can be implement able by executing a deterioration level calculation program for causing an arithmetic unit of the computer to perform a process of the deterioration level calculation method. Accordingly, a specific description will be made on a process of the deterioration level calculation program in a case where the deterioration level calculation method for a secondary battery according to Embodiment 1 is to be performed in line with the deterioration level calculation program. Accordingly, FIG. 5 illustrates a flowchart for explaining an operation of the deterioration level calculation program for a secondary battery according to Embodiment 1.

As illustrated in FIG. 5, the deterioration level calculation program for a secondary battery according to Embodiment 1 begins with applying a measured value acquisition process to a secondary battery, the measured value acquisition process of generating a measured value charging rate voltage curve (for example, a measured value SOC-OCV curve) by using a measurement result of an open circuit voltage at a charging rate in a range from 0% to 100% (Step S1).

Then, the deterioration level calculation program for a secondary battery according to Embodiment 1 performs a measured value differential plot generation process of generating a measured value differential plot (for example, a measured value dV/dQ plot) where a differential value of the measured value SOC-OCV curve is plotted (Step S2).

Then, the deterioration level calculation program for a secondary battery according to Embodiment 1 initializes the fitting function G represented by (1) Expression by setting the shift amount p1 at 0 and the scaling rate p2 at 1 (Step S3). After that, the deterioration level calculation program for a secondary battery according to Embodiment 1 performs a theoretical value generation process of generating a theoretical value charging rate voltage curve (for example, a theoretical value SOC-OCV curve) computed from a difference between a cathode open circuit potential theoretical value curve (for example, a theoretical value cathode OCP) computed from a content of at least one component (for example, lithium iron phosphate) of the cathode composite of the secondary battery and an anode open circuit potential theoretical value curve (for example, a theoretical value anode OCP) computed from a content of at least one component (for example, carbon) of the anode composite of the secondary battery and generating a theoretical value dV/dQ plot by using the fitting function G (for example, (1) Expression) for obtaining a theoretical value differential plot (for example, a theoretical value dV/dQ plot) that is a differential value of the theoretical value SOC-OCV curve (Step S4).

Here, in the foregoing description, the form of the theoretical value cathode OCP is theoretically derivable from the type and content of the cathode active material. Examples of the cathode active material include lithium cobaltite in addition to lithium iron phosphate. Similarly, the form of the theoretical value anode OCP is theoretically derivable from the type and content of the anode active material. The anode active material is often a material consisting mainly of carbon.

Then, the deterioration level calculation program for a secondary battery according to Embodiment 1 performs an evaluation value computation process of computing an evaluation value J by using an evaluation function (for example, (2) Expression) for computing the evaluation value J, the evaluation value J indicating a magnitude of a difference between the theoretical value dV/dQ plot and the measured value dV/dQ plot by (Step S5). Here, the evaluation function has a whole evaluation term (the first term of (2) Expression) representing a difference between the theoretical value dV/dQ plot and the measured value dV/dQ plot as a whole, a high charging rate region evaluation term (for example, the third term of (2) Expression) representing a difference between the theoretical value dV/dQ plot and the measured value dV/dQ plot in a high charging rate region, and a low charging rate region evaluation term (for example, the second term of (2) Expression) representing a difference between the theoretical value dV/dQ plot and the measured value dV/dQ plot in a low charging rate region. In the evaluation function, the high charging rate region evaluation term and the low charging rate region evaluation term are weighted more than the whole evaluation term.

Then, the deterioration level calculation program for a secondary battery according to Embodiment 1 repeats the theoretical value generation process (Step S4) and the evaluation value computation process (Step S5) with changes of a shift amount parameter p1 and a scaling rate parameter p2, the shift amount parameter p1 causing the cathode open circuit potential theoretical value curve (for example, the theoretical value cathode OCP) to shift in a charging rate direction in the fitting function, the scaling rate parameter p2 adjusting a length in the charging rate direction of the anode open circuit potential theoretical value curve (for example, the theoretical value anode OCP) in the fitting function, and performs an analysis process of outputting the shift amount parameter p1 at which the evaluation value J is minimized as the deterioration level of the secondary battery (Steps S6 to S8). In addition, in the output process in Step S8, the scaling rate parameter p2 at which the evaluation value J is minimized is outputted as a parameter of the cathode/anode capacity ratio of the secondary battery.

According to the foregoing description, it is possible to easily implement the deterioration level calculation method for a secondary battery according to Embodiment 1 by causing an arithmetic apparatus such as a computer to execute the deterioration level calculation program.

Embodiment 2

In Embodiment 1, the evaluation value J is computed by applying the differential plot of the charging rate voltage curve to the evaluation function. In Embodiment 2, description will be made on a method including computing the evaluation value J by applying the charging rate voltage curve itself to the evaluation function in place of the differential plot.

In Embodiment 2, (3) Expression is used as the fitting function in place of (1) Expression.

[Math. 3]

$$G(x,p_1,p_2)=f_p(x+p_1)-f_n(p_2x) \quad (3)$$

The fitting function G of (3) Expression makes it possible to compute the theoretical value charging rate voltage curve. Incidentally, p1 and p2 in (3) Expression are the parameters p1, p2 in (1) Expression, respectively.

Further, in Embodiment 2, (4) Expression is used as the evaluation function.

[Math. 4]

$$J = \int_0^{100} (OCV_{ideal} - OCV_{data})^2 dSOC \quad (4)$$
$$+k_1 \int_0^{\alpha} (OCV_{ideal} - OCV_{data})^2 dSOC$$
$$+k_2 \int_{\beta}^{100} (OCV_{ideal} - OCV_{data})^2 dSOC$$

OCVideal in (4) Expression, which is a theoretical value charging rate voltage curve, is derivable by (3) Expression. OCV data, which is a measured value charging rate voltage curve, is a curve that is a source for the measured value dV/dQ plot in Embodiment 1.

The evaluation value J is computed without differentiating the charging rate voltage curve in this manner, which makes it possible to skip a process of generating a differential plot. In addition, in (4) Expression, a calculation with a logarithmic value as in the second term in Expression (2) is not performed. This is because the charging rate voltage curve has no peak as a differential plot and a significance of applying sensitivity adjustment to the peak is small, accordingly.

Embodiment 3

In Embodiment 3, description will be made on another example of the fitting function. First, (5) Expression is provided as a first modified example of the fitting function.

[Math. 5]

$$G(x, p_3, p_4) = \frac{d}{dx}\{f_p(x + p_3)\cdot p_4 - f_n(x)\} \quad (5)$$

In the fitting function represented by (5) Expression here includes a shift amount parameter p3 that causes the cathode OCP to shift in the charging rate direction and a scaling rate parameter p4 that adjusts the length in the charging rate direction of the cathode OCP. In other words, the fitting function of (5) Expression causes only the cathode OCP to change, thereby manipulating the form of the theoretical value charging rate voltage curve.

Subsequently, (6) Expression is provided as a second modified example of the fitting function.

[Math. 6]

$$G(x, p_5, p_6) = \frac{d}{dx}\{f_p(p_5) - f_n(x + p_6)\} \quad (6)$$

The fitting function represented by (6) Expression here includes a scaling rate parameter p5 that adjusts the length in the charging rate direction of the cathode OCP and the shift amount parameter p6 that causes the anode OCP to shift in the charging rate direction. In other words, the fitting function of (6) Expression applies a parameter manipulation inverse to (1) Expression to the cathode OCP and the anode OCP.

Thus, in the fitting function, a way of applying the shift amount parameter and the scaling rate parameter to the cathode OCP and the anode OCP is selectable as desired in accordance with the form of the OCP, the characteristics of a battery, or both.

The first to third embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:
1. A deterioration level calculation method for a secondary battery, the method comprising causing a computer comprising a processor and a memory to perform arithmetic processes including:

measuring an open circuit voltage of a specific secondary battery by connecting the secondary battery to a voltage measurement device at a charging rate in a range from 0% to 100% to obtain measurement data;

a measured value acquisition process of generating a measured value charging rate voltage curve for the secondary battery by using a measurement result of the open circuit voltage at a charging rate in a range from 0% to 100%;

a theoretical value generation process of generating a theoretical value charging rate voltage curve computed from a difference between a cathode open circuit potential theoretical value curve computed from a content of at least one component of a cathode composite of the secondary battery by using a fitting function and an anode open circuit potential theoretical value curve computed from a content of at least one component of an anode composite of the secondary battery;

an evaluation value computation process of computing, with use of an evaluation function to compute an evaluation value, the evaluation value, the evaluation value indicating a magnitude of a difference between the theoretical value charging rate voltage curve and the measured value charging rate voltage curve; and

US 12,674,845 B2

13
14 an analysis process of repeating the theoretical value generation process and the evaluation value computation process with changes of a shift amount parameter and a scaling rate parameter and outputting the shift amount parameter at which the evaluation value is minimized as a deterioration level of the secondary battery, in the fitting function, the shift amount parameter for shifting one of the theoretical positive open circuit potential value curve and the theoretical negative open circuit potential value curve in the charging rate direction, the scaling rate parameter for adjusting the length of the other curve in the charging rate direction; and determining, based on an outputted deterioration level, whether the secondary battery is suitable for reuse in a different application than its original application, wherein the evaluation function includes a whole evaluation term representing a difference between the theoretical value charging rate voltage curve and the measured value charging rate voltage curve as a whole, a high charging rate region evaluation term representing a difference between the theoretical value charging rate voltage curve and the measured value charging rate voltage curve in a high charging rate region, and a low charging rate region evaluation term representing a difference between the theoretical value charging rate voltage curve and the measured value charging rate voltage curve in a low charging rate region, the high charging rate region evaluation term and the low charging rate region evaluation term being weighted higher than the whole evaluation term.

2. The deterioration level calculation method for a secondary battery according to claim 1, further comprising a measured value differential plot generation process of generating a measured value differential plot where a differential value of the measured value charging rate voltage curve is plotted, wherein in the theoretical value generation process, a theoretical value differential plot that is a differential value of the theoretical value charging rate voltage curve is generated using the fitting function, and in the evaluation value computation process, evaluation is made by applying the measured value differential plot as the evaluation function in place of the measured value charging rate voltage curve and applying the theoretical value differential plot in place of the theoretical value charging rate voltage curve.

3. The deterioration level calculation method for a secondary battery according to claim 2, wherein at least one of the high charging rate region evaluation term and the low charging rate region evaluation term uses a logarithmic value as a value for evaluating the difference.

4. The deterioration level calculation method for a secondary battery according to claim 1, wherein the scaling rate parameter determined in the analysis process is outputted as a parameter for determining a cathode/anode capacity ratio of the secondary battery.

5. The deterioration level calculation method for a secondary battery according to claim 1, wherein the cathode open circuit potential theoretical value curve is computed based on a content of lithium iron phosphate contained in the cathode composite, and the anode open circuit potential theoretical value curve is computed based on a content of carbon contained in the anode composite.

6. A non-transitory computer-readable medium storing a deterioration level calculation program for a secondary battery, the program being configured to cause an arithmetic unit of a computer to perform:

measuring an open circuit voltage of a specific secondary battery by connecting the secondary battery to a voltage measurement device at a charging rate in a range from 0% to 100% to obtain measurement data;

a measured value acquisition process of generating a measured value charging rate voltage curve for the secondary battery by using a measurement result of the open circuit voltage at a charging rate in a range from 0% to 100%;

a theoretical value generation process of generating a theoretical value charging rate voltage curve computed from a difference between a cathode open circuit potential theoretical value curve computed from a content of at least one component of a cathode composite of the secondary battery by using a fitting function and an anode open circuit potential theoretical value curve computed from a content of at least one component of an anode composite of the secondary battery;

an evaluation value computation process of computing, with use of an evaluation function to compute an evaluation value, the evaluation value, the evaluation value indicating a magnitude of a difference between the theoretical value charging rate voltage curve and the measured value charging rate voltage curve; and an analysis process of repeating the theoretical value generation process and the evaluation value computation process with changes of a shift amount parameter and a scaling rate parameter and outputting the shift amount parameter at which the evaluation value is minimized as a deterioration level of the secondary battery, in the fitting function, the shift amount parameter for shifting one of the theoretical positive open circuit potential value curve and the theoretical negative open circuit potential value curve in the charging rate direction, the scaling rate parameter for adjusting the length of the other curve in the charging rate direction; and determining, based on an outputted deterioration level, whether the secondary battery is suitable for reuse in a different application than its original application, wherein the evaluation function includes a whole evaluation term representing a difference between the theoretical value charging rate voltage curve and the measured value charging rate voltage curve as a whole, a high charging rate region evaluation term representing a difference between the theoretical value charging rate voltage curve and the measured value charging rate voltage curve in a high charging rate region, and a low charging rate region evaluation term representing a difference between the theoretical value charging rate voltage curve and the measured value charging rate voltage curve in a low charging rate region, the high charging rate region evaluation term and the low charging rate region evaluation term being weighted higher than the whole evaluation term.

* * * * *